United States Patent [19]

Thornton, Jr.

[11] 4,176,294

[45] Nov. 27, 1979

[54] METHOD AND DEVICE FOR EFFICIENTLY GENERATING WHITE LIGHT WITH GOOD RENDITION OF ILLUMINATED OBJECTS

[75] Inventor: William A. Thornton, Jr., Cranford, N.J.

[73] Assignee: Westinghouse Electric Corp., Pittsburgh, Pa.

[21] Appl. No.: 747,141

[22] Filed: Dec. 3, 1976

Related U.S. Application Data

[63] Continuation of Ser. No. 619,544, Oct. 3, 1975, abandoned, which is a continuation of Ser. No. 96,744, Dec. 10, 1970, abandoned, which is a continuation-in-part of Ser. No. 742,291, Jul. 3, 1968, abandoned.

[51] Int. Cl.$^2$ .................. H01J 61/62; H01J 63/04; H01J 61/00
[52] U.S. Cl. ............................... 313/485; 313/487; 313/498; 313/503; 315/248
[58] Field of Search ................................ 313/468

[56] References Cited

U.S. PATENT DOCUMENTS

| | | | |
|---|---|---|---|
| 3,071,708 | 1/1963 | Stanavage | 313/503 |
| 3,319,119 | 5/1967 | Rendina | 315/248 |
| 3,359,211 | 12/1967 | Jaffe | 252/30.14 F |
| 3,445,719 | 5/1969 | Thouret et al. | 315/49 |
| 3,449,258 | 6/1969 | Ropp et al. | 252/301.4 R |
| 3,458,779 | 7/1969 | Blank et al. | 317/234 |
| 3,481,884 | 12/1969 | Palilla et al. | 313/468 |
| 3,501,412 | 3/1970 | Ropp | 252/301.4 R |
| 3,509,065 | 4/1970 | Palilla | 252/301.4 P |
| 3,513,103 | 3/1970 | Shaffer | 252/301.4 P |
| 3,579,016 | 5/1971 | Palilla | 313/468 |
| 4,038,204 | 7/1977 | Wachtel | 252/301.4 P |

FOREIGN PATENT DOCUMENTS 513570 6/1938 United Kingdom .

OTHER PUBLICATIONS

Elenbaas, "Fluorescent Lamps and Lighting," Philips Technical Library, 1962; pp. 42-49, 56 and 57 cited.
DeMent, "Fluorochemistry," Chemical Publishing Company, Inc.: Brooklyn, N. Y., 1945; p. 438 cited.
Wachtel, application #726,464; filed 5/3/68.
Godlove, "The Limiting Colors Due to Ideal Absorption and Transmission Bands," Journal of the Optical Society of America; vol. 37, #10; Oct. 1947; pp. 778–791.
MacAdam, "Photometric Relationships Between Complementary Colors," J.O.S.A.; vol. 28; Apr. 1938; pp. 103–110.
Barnes, "Band Systems for Appraisal of Color Rendition," J.O.S.A.; vol. 47, #12, pp. 1124–1129; Dec. 1957.
"Optical Characteristics of Cathode Ray Tube Screens," #16-B; Aug. '71, p. 47.

*Primary Examiner*—Robert Segal
*Attorney, Agent, or Firm*—W. D. Palmer

[57] ABSTRACT

Method and device for efficiently generating white light with good color rendition of illuminated objects. This is achieved by blending three different colors of light, namely, a green to yellow-green color of light, an orange to red color of light, and a purplish-blue to greenish-blue color of light. The relative intensities of the blended colors of light are selected to produce white light of predetermined ICI coordinates. The resulting blended light has at most only a limited amount of radiations of a wavelength shorter than 430 nm and at most only a limited amount of radiations of a wavelength longer than 630 nm. Also, the blended light has at most only a limited amount of radiations of a wavelength of about 575 nm and at most only a limited amount of radiations of a wavelength of about 500 nm.

31 Claims, 11 Drawing

THE (x,y)-CHROMATICITY DIAGRAM OF THE ICI SYSTEM

METHOD AND DEVICE FOR EFFICIENTLY GENERATING WHITE LIGHT WITH GOOD RENDITION OF ILLUMINATED OBJECTS

This is a continuation of application Ser. No. 619,544, filed Oct. 3, 1975 (now abandoned) which in turn is a continuation of application Ser. No. 96,774, filed Dec. 10, 1970 (now abandoned) which in turn is a continuation-in-part of application Ser. No. 742,291, filed July 3, 1968 (now abandoned), all by the same inventor and owned by the same assignee.

BACKGROUND OF THE INVENTION

White light emission of a predetermined chromaticity can be generated by innumerable spectral power distributions (known in the art as SPD), each of which can be particularly selected to provide lumen output or color rendition. Most fluorescent lamps as marketed today are designed to generate radiations of a "white" color as efficiency as possible so that the best possible light output will be achieved for a given wattage input, and the fixed spectral energy distribution of so-called halophosphate phosphor is generally used throughout the industry. Of course, for best color rendition of illuminated objects, the illumination should approximate that of daylight. In recent years, particularly for illumination in clothing and similar stores, more emphasis is being placed upon good color rendition of fabrics in order that the fabrics appear much the same in the store and in daylight. When fluorescent lamps are modified to improve the color rendition of objects illuminated thereby, usually be adding more blue and more red emission, the phosphors which emit in the shorter visible wavelengths and the longer visible wavelengths also normally generate substantial amounts of emission in the near ultraviolet and near infrared, respectively. This ultraviolet emission and infrared emission represents wasted energy, since it is invisible, which substantially decreases the luminous deficiency for such lamps for converting electrical energy to visible radiation.

The internationally accepted method for standardizing and measuring the color rendering properties of light sources is set forth in the publication of the International Commission on Illumination, identified as publication C.I.E. No. 13 (E-1.3.2.) 1965.

SUMMARY OF THE INVENTION

The present method and device efficiently generate white light and illuminate objects with a color appearance which is reasonably representative of their coloar appearance under natural light. In such a device, a three-component, light-generating medium forms an operative part thereof and the device is connectable to a source of electric energy to energize the light-generating medium to a visible-light-generating condition. A first component of the light-generating medium, when energized, provides a green to yellow-green emission located substantially in the wavelength range of from 515 nm to 570 nm. A second component of the light-generating medium, when energized, generates an orange to red emission located substantially in the wavelength range of from 588 nm to 630 nm. The third component of the light generating medium, when energized, generates a purplish-blue to greenish-blue emission located substantially in the wavelength range of from 430 nm to 485 nm. The relative proportions of the individual components of the light-generating medium are such that when the radiations are blended there is produced white light of predetermined ICI coordinates. In accordance with the present method, there is blended together a first light component which is green to yellow-green in color with a second light component which is orange to a red in color and a third light component which is purplish-blue to greenish-blue in color. These blended light components have at most only a limited amount of radiation of a wavelength shorter than 430 nm and at most only a limited amount of radiation of wavelength longer than 630 nm, as well as at most only a limited amount of radiation of a wavelength of about 575 nm and at most only a limited amount of radiation of a wavelength of about 500 nm. The relative light intensities of the three light components are controlled with respect to one another to produce a white light of predetermined ICI coordinates.

BRIEF DESCRIPTION OF THE DRAWINGS

For a better understanding of the invention, reference may be had to the preferred embodiment, exemplary of the invention shown in the accompanying drawings in which.

DESCRIPTION OF THE PREFERRED EMBODIMENTS

Figure 1:
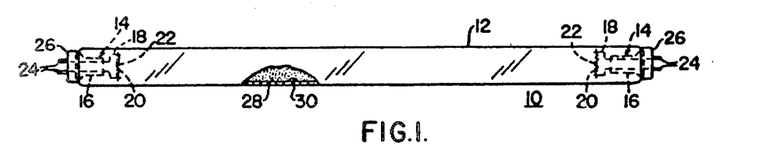
FIG. 1 is an elevational view, partly in section, of a fluorescent lamp constructed in accordance with the present invention.

With specific reference to the form of the invention illustrated in the drawings, the numeral 10 in FIG. 1 represents a 40 W T12 type fluorescent lamp comprising a tubular vitreous envelope 12 which may be fabricated of soda-lime-silica glass, for example, having mounts 14 sealed into either end thereof, as is customary. Each mount comprises a vitreous portion 16 sealed to an end of the envelope 12 with lead-in conductors 18 sealed therethrough and supporting at their inwardly extending extremities refractory metal coils 20, which are fabricated of tungsten, for example. These coils are normally of a coiled-coil construction or of a triple-coil construction, and contained within the turns of the inner coil or coils 20 is a filling of conventional electron-emitting material 22.

Electrical connection for the lead-in conductors 18 is normally effected by contact pins 24 which project from supporting base caps 26 at either end of the lamp. The envelope 12 has coated on its interior surface phosphor material 28, which in accordance with the present invention is a three-component mixture of different phosphors, as will be explained in greater detail hereinafter. The envelope also contains a filling of argon or other inert, ionizable gas, at a pressure of about 4 mm for example, in order to facilitate starting, as well as a small charge of mercury 30. In the operation of such a lamp, when the electrodes 20 are electrically connected to a source of predetermined energizing potential via the contact pins 24, the device is operated with a predetermined power input to sustain between the electrodes a gas discharge which generates 2537 AU ultraviolet radiations as well as a limited amount of visible, blue radiations.

The finely divided phosphor layer 28 comprises a three-component mixture of different phosphors. A first component of the phosphor mixture, when excited by the ultraviolet radiations generated by the discharge, exhibits an emission spectrum centered generally in the green to yellow-green region of the visible spectrum. A second component of the mixture exhibits a line or a very narrow band emission located primarily in the orange to red region of the visible spectrum. The remaining component of the mixture exhibits a line emission or a very narrow band emission which is located primarily in the purplish-blue to greenish-blue region of the visible spectrum. The relative proportions of the foregoing phosphor components are so selected that when their emissions are blended with the visible emission, if any, generated by the discharge, there is produced white light of predetermined ICI coordinates, and because of the selected spectrum of radiations which are generated, the color rendition of objects illuminated thereby is excellent.

Figure 2:
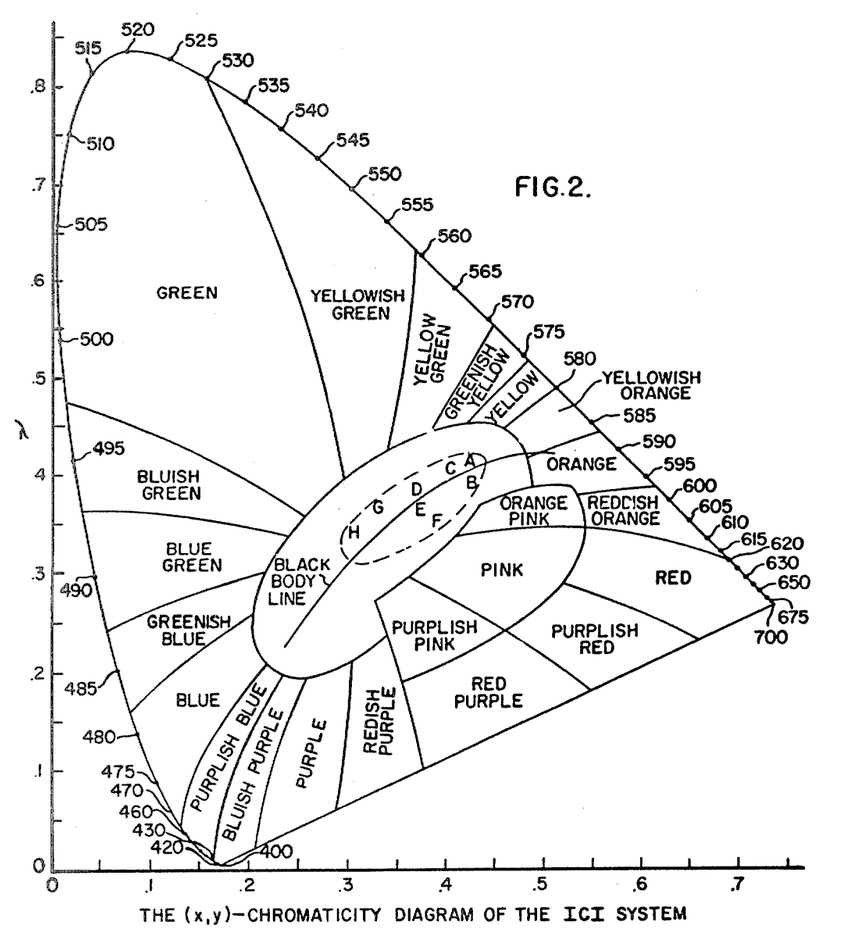
FIG. 2 illustrates the x, y-chromaticity diagram of the ICI system.

In FIG. 2 is shown the x, y-chromaticity diagram of the ICI system and superimposed thereon are the various colors shown as letters which define the colors of present fluorescent lamps. The ICI color system is described in detail in the "Handbook of Colorimetry" by Arthur C. Hardy, The Technology Press, Massachusetts Institute of Technology (1936). The color indicia which are superimposed upon the ICI diagram are identified as follows:

| Indicia | Lamp Color |
| --- | --- |
| A | Warm white |
| B | Deluxe warm white |
| C | White |
| D | Cool white |
| E | Deluxe cool white |
| F | Soft white |
| G | Bluish white |
| H | Daylight |

The ICI illuminant "C" is also shown and represents the color of natural daylight". As a general rule, any color which falls within the area enclosed by the dashed line will have a "white" appearance to the eye.

Considering the present invention more specifically, the first component of the light-generating medium, when energized, exhibits a green to yellow-green emission located substantially in the wavelength range of from 515 nm to 570 nm. This emission can be a line-type emission and/or a band-type emission having a bandwidth of less than about 80 nm as measured at an emission intensity which is 50% of the maximum measured emission intensity. A second of the remaining components of the light-producing media, when energized, generates an orange to red emission located substantially in the wavelength range of from 588 nm to 630 nm with substantially no emission in the infrared. This emission can be a line-type emission and/or a band-type emission having a bandwidth of less than about 40 nm as measured at an emission intensity which is 50% of the maximum measured emission intensity. The third of the components of the light-producing media, when energized, generates a purplish-blue to greenish-blue emission located primarily in the wavelength range of from 430 nm to 485 nm with substantially no emission in the ultraviolet. This blue emission can be a line-type emission and/or a band-type emission having a bandwidth of less than about 40 nm as measured at an emission intensity which is 50% of the maximum measured emission intensity. Any of the line-type emissions can be a single line emission or a multiple line emission the principal members of which fall within the wavelength ranges as specified. Any of the band-type emissions can be a single bell-shaped band or plural bands having an average overall bandwidth as specified.

Figure 3:
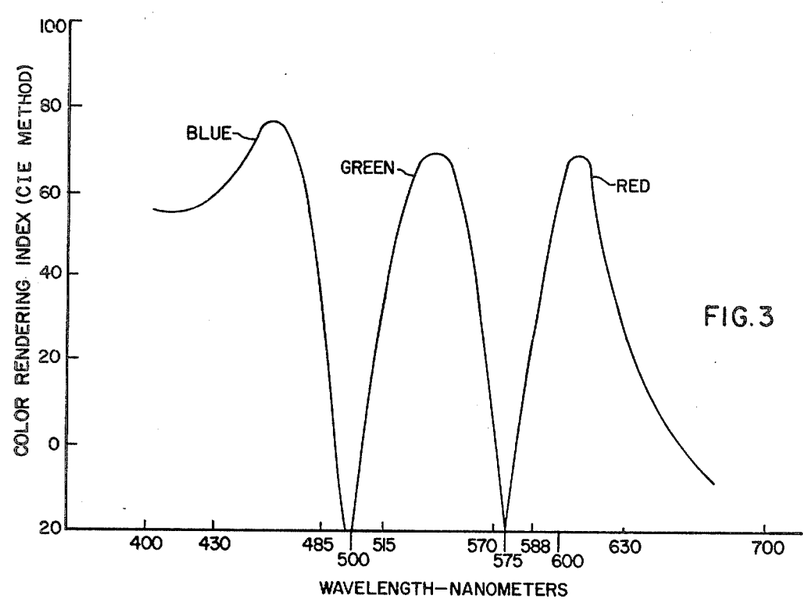
FIG. 3 is a graph of color rendering index versus wavelength for each of three emissions blended to produce a predetermined white light.

In FIG. 3 is plotted color rendering index versus wavelength for each of three emissions combined to make white light. In explanation of this figure, it is well known that white light can be readily produced by combining three wavelengths such as 450 nm, 500 nm and 575 nm. It is not known, however, that the color rendition of objects illuminated by such white light would be disastrously poor. In other words, an item of apparel which was illuminated by such light would appear completely different when taken into daylight. If the item of apparel were illuminated by white light formed of three different colors of light comprising purplish-blue radiations of 450 nm, yellowish-green radiations of 535 nm and reddish-orange radiations of 610 nm, the resulting colors of illuminated objects would be very "good", as judged by the normal observer. The curves as shown in FIG. 3 were prepared by utilizing three optimum emissions, namely 450 nm, 540 nm and 610 nm. Two of these three optimum emissions were maintained at the foregoing specified wavelengths and the third was varied over a wide range to show the effect on color rendition, with the composite color of the resulting blend of radiator always maintained the same to produce so-called "daylight" white light. By way of further explanation, in FIG. 3 the curve designated "Blue" was obtained by maintaining the emissions at 540 nm and 610 nm constant, while varying the short wavelength radiations from 410 nm to approximately 500 nm. As shown, the color-rendering index, as measured by the aforementioned CIE method, peaks when the radiations pass through the 450 nm value and drops to a value of −20 on the color rendering index when the radiations are about 500 nm. The curve designated "Green" in FIG. 3 represents the results obtained by maintaining the 450 nm and 610 nm radiations constant while varying the "middle" radiations from 500 nm to 575 nm. As shown, the radiations of a wavelength of 500 nm and 575 nm produced an extremely poor color rendition of illuminated objects. The curve "Red" shown in FIG. 3 was obtained by maintaining constant the 450 nm radiations and 540 nm radiations while varying the long wavelength radiations over the range as indicated in order to obtain the resulting variation in color rendering index.

Figure 4:
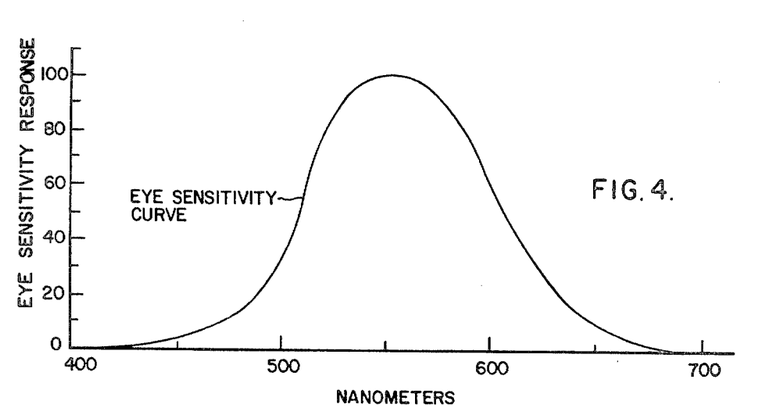
FIG. 4 is the "eye-sensitivity" curve which is a graph of eye-sensitivity to various wavelengths of light versus wavelength in nanometers.

As a practical matter, radiations which have a wavelength less than 450 nm are of somewhat limited benefit with respect to providing good color rendition, and these radiations are extremely poor with respect to providing illumination to which the human eye is appreciably sensitive, as shown in the eye-sensitivity curve of FIG. 4. With respect to the long wavelength region of the visible spectrum, as shown in FIG. 3, radiations having a wavelength longer than 630 nm are quite poor with respect to providing good color rendition of illuminated objects, and as shown in the eye-sensitivity curve of FIG. 4, the eye is also relatively insensitive to such radiations. Thus the presence of these radiations also impairs the efficiency of production of light by an artificial light source.

Referring further to FIG. 3, as a practical matter, it is desirable to minimize the radiations in the range of 485 to 515 nm, which provide a color rendering index of less than 30. Also, it is desirable to minimize those radiations falling within the range of 570 nm to 588 nm which provide a color rendering index of less than 30. Because of the high sensitivity of the human eye to yellow-green radiations, as a matter of practicality it may sometimes be desirable to use yellow-green radiations which fall within the range of 565 nm to 570 nm, even though these radiations provide a relatively poor color rendition.

In further explanation of FIG. 3, in order to produce white light very efficiently and illuminate objects with a realistic color, as measured against the color of the objects under natural daylight, the efficiency of light which is generated, as measured in lumens per watt, is limited by the amount of electrical energy which is supplied to the light source, along with the efficiency of the conversion mechanism for generating visible light. If a substantial portion of the visible light which is generated has a wavelength of about 500 nm and 575 nm, the resulting efficiency of the generated light, as measured in lumens per watt, for example, can be relatively high, but the color appearance of illuminated objects will be completely unrealistic. If, however, the light generating media, such as fluorescent materials, are so selected as to produce light having a wavelength which corresponds to those wavelengths which produce the best color rendering index, as shown in FIG. 3, then both the efficiency, as measured in lumens per watt, and the color rendering index of the resulting white light can be excellent.

Referring to FIG. 3, it is interesting to note that in accordance with the present invention, most yellow-appearing radiations are minimized as much as possible in order to provide a good color rendition of illuminated objects. To express this another way, the available energy is concentrated in other regions of the visible spectrum in order to achieve the best possible efficiency of light generation (i.e., lumens per watt) commensurate with good color rendition of illuminated objects. This would appear to be contrary to the relatively high degree of sensitivity of the human eye for such yellow-appearing radiations, see FIG. 4.

Following are specific examples of combinations of phosphor mixtures prepared in accordance with the present invention.

EXAMPLE I

Figure 5:
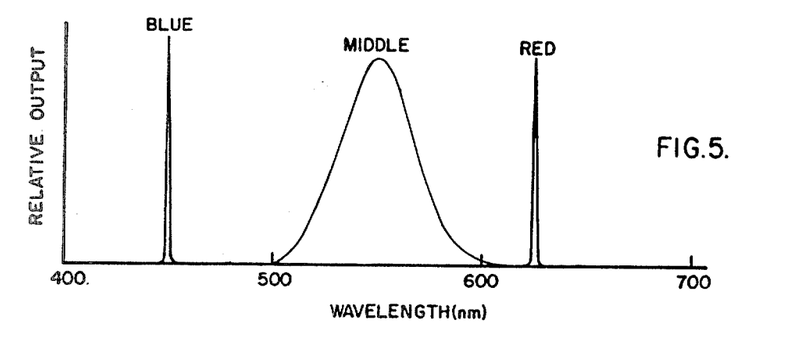
FIG. 5 is a graph of relative output versus wavelength for a representative mixture of light emitters blended together in accordance with the present invention.

Fifty-three percent by weight of the naturally occurring mineral calcium larsenite ($Zn_4Ca_3Pb_1Si_4O_{16}$:Mn) phosphor, which emits in the yellowish-green, is blended with 12% by weight of erbium-activated yttrium phosphate, which emits in the blue, and 35% by weight of europium-activated lanthanum oxide, which emits in the red. The manganese-activated "middle" phosphor has a relatively broad band emission as is generally illustrated in FIG. 5. The erbium-activated yttrium phosphate has a line emission spectrum in the blue region of the visible spectrum, as represented by the "blue" line shown in FIG. 5. The europium-activated lanthanum oxide has a line emission located primarily in the reddish-orange to red region of the visible spectrum, as represented by the "red" line in FIG. 5. This phosphor mixture is used as a coating on the lamp 10.

EXAMPLE II

As a second example, the middle phosphor, which has its emission spectrum centered generally in the green to yellow-green region of the visible spectrum, can comprise one or more line-emitting phosphors and an example of such a phosphor is erbium-activated yttrium oxide. Such a phosphor when used in amounts of 57% by weight blended with 16% by weight of erbium-activated yttrium phosphate and 27% by weight of samarium-activated lanthanum oxide will produce what appears as a spectrum of emissions formed by a composite of line emissions.

The middle component of the mixture can be formed by other conventional phosphors which have an emission spectrum centered generally in the green to yellow-green region of the visible spectrum with substantially no emission in the infrared or ultraviolet. An example of such other phosphor is manganese-activated zinc silicate which has a relatively narrow emission (bandwidth=41 nm) which peaks at approximately 530 nm.

The foregoing blends are mixed in such proportions as to provide a composite appearance of "white" light and the techniques for proportioning such blends are well known. Briefly, referring to FIG. 2, any color of material for which the ICI coordinates are known can be blended with any other known color and the resulting color of the blend will fall somewhere on the straight line between the two colors on the ICI diagram, depending upon the relative proportions of the constituents. Thus when the ICI color coordinates of three individual phosphor components are known, it is a simple matter to formulate a blend of "white" emitting phosphor which will fall within the area bounded by the dashed line as shown in FIG. 2.

EXAMPLE III

Figure 6:
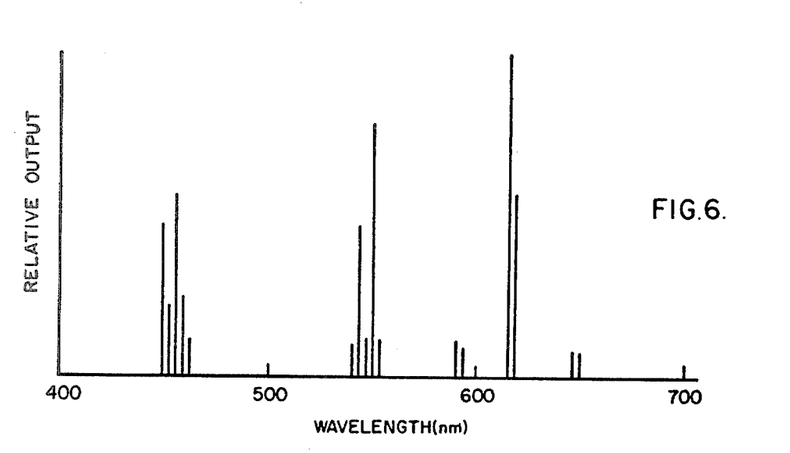
FIG. 6 is a graph of relative output versus wavelength illustrating the overall composite emission for material which generates light as a series of line-type emissions.

Thulium-activated yttrium vanadate serves as the blue-emitting component, terbium-activated yttrium vanadate serves as the green-emitting component and europium-activated yttrium vanadate serves as the red-emitting component. These phosphors are mixed in the proper proportions in order to generate white light of the desired chromaticity. All of these rare-earth activated phosphors are line emitters and their emissions are illustrated in FIG. 6. Alternatively, the foregoing activators may be used together in the same host crystal and the emissions can be substantially duplicated, and the single phosphor will serve the function of three separate emitters, in accordance with the present invention. The foregoing activators can also be incorporated into sulfide-type phosphors and excited to light emission by an electric field, in accordance with well-known electroluminescence techniques.

EXAMPLE IV

Figure 7:
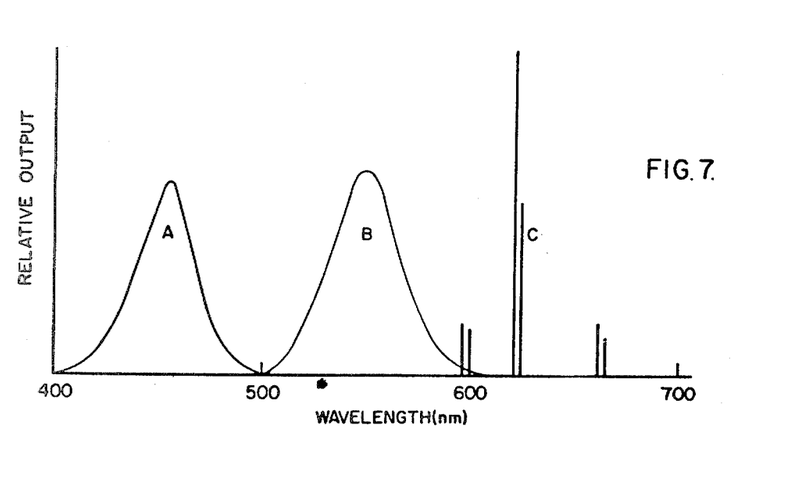
FIG. 7 is a graph of relative output versus wavelength illustrating the overall composite emission for three different phosphors, two of which are so-called band emitters, and one of which has an emission comprising a group of lines, with the principal lines of the line-emitter located within the red region of the visible spectrum.

A phosphor blend is formed of a mixture of strontium chloro-apatite activated by divalent europium, as disclosed in copending application Ser. No. 726,464, filed May 3, 1968 by A. Wachtel, now U.S. Pat. No. 4,038,204, dated July 26, 1977 and owned by the present assignee, which provides the blue component. The formulation for this phosphor is $Sr_5(PO_4)_3Cl: Eu^{2+}$, where Eu is from $3.5 \times 10^{-3}$ to $3.5 \times 10^{-2}$. The natural mineral calcium larsenite provides the middle component which is yellowish-green in appearance, and yttrium oxide activated by tervalent europium provides the red-emitting component. The formulation for this phosphor is $Y_2O_3: EU^{3+}$, wherein the gram-atom ratio of EU to Y is from 0.07:1 to 0.0825:1. This latter phosphor is described in U.S. Pat. No. 3,449,258 dated June 10, 1969. These phosphors fulfill the requirements of the three separate phosphor components, and when combined in the weight ratio of 17:58:25, respectively, will generate white light in a very efficient manner in a conventional 40 watt fluorescent lamp with very good color rendition. The relative emissions of the foregoing phosphors are shown in FIG. 7 wherein the blue emitter is designated "A", the yellowish-green emitter "B", and the red emitter "C".

EXAMPLE V

In the phosphor blend as set forth under Example IV, the mineral larsenite is replaced by the synthetic phosphor manganese-activated zinc germanate. The weight ratio of the chloro-apatite to zinc germanate to yttrium oxide is 15:42:43.

EXAMPLE VI

Figure 8:
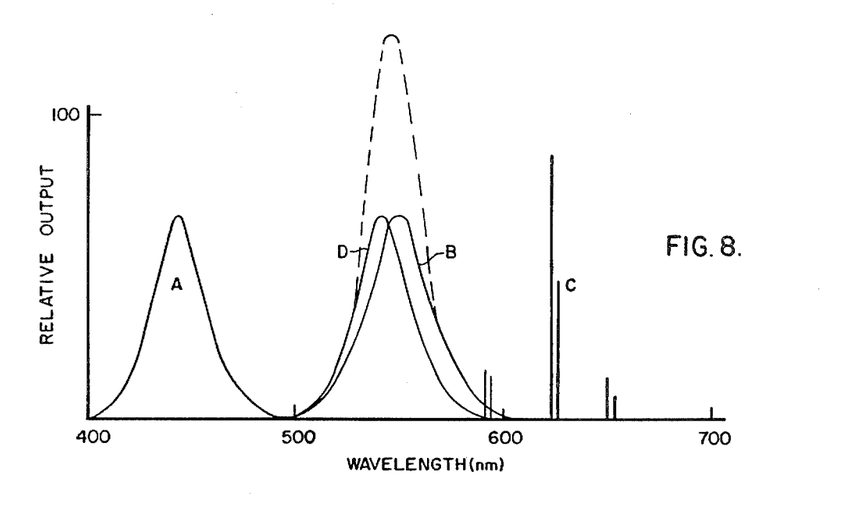
FIG. 8 is a graph of relative output versus wavelength illustrating the overall composite emission of different phosphors wherein the blue component is a single band emitter, the middle component is a mixture of two band emitters, with the summation of the outputs being shown as a dashed line, and the red component is a line-type emitter, with the principal lines of the line-emitter located within the red region of the visible spectrum.

In the blend set forth under Example IV, the mineral larsenite is replaced by a mixture of larsenite "B", see FIG. 8, and zinc germanate activated by manganese "D", see FIG. 8, and the graphical representation of the resulting emissions are set forth in FIG. 8. The color rendition of such a phosphor mixture is excellent.

Figure 9:
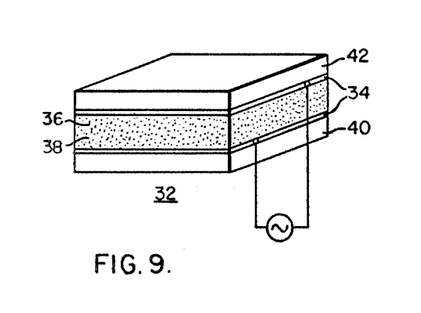
FIG. 9 is a perspective view of an electroluminescent device constructed in accordance with the present invention.

In FIG. 9 is shown an electroluminescent device 32 which comprises spaced electrodes 34, at least one of which is light transmitting, having sandwiched therebetween a mixture of phosphor 36 in accordance with the present invention, which phosphor is embedded in a light transmitting dielectric material to form a layer 38. Both electrodes are desirably protected by layers 40 and 42. In this device the phosphor comprises a mixture of copper-activated zinc sulfide which provides the blue emission, copper- and manganese-activated zinc sulfide which provides a yellow-green emission, and copper-activated zinc selenide or copper-activated zinc-mercuric sulfide, which provides a red emission.

Figure 10:
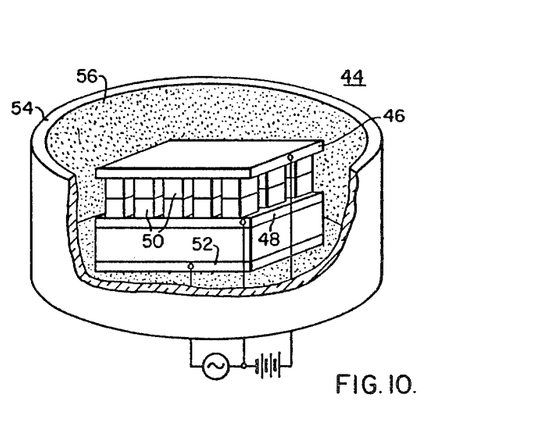
FIG. 10 is a perspective view, partly broken away, of a solid-state type of device constructed in accordance with the present invention.

In FIG. 10 is shown an alternative type of light-generating device 44 which comprises a combination of junction-type emitters and electroluminescence, with the individual emissions blended together by a light-scattering coating. More specifically, the spaced electrodes 46 and 48, which are adapted to have a DC potential applied thereacross, have sandwiched therebetween a plurality of junctions 50. As an example, the junctions 50 are GacP,Sb) which is a red-emitting type junction, and in this embodiment, the blue-emitting and yellow-green emitting components of the electroluminescent portion of the device can be copper-activated zinc sulfide, as set forth hereinbefore. Alternatively, the junction emitters can comprise a mixture of yellow-green emitting junctions such as silicon carbide and the red-emitting junctions such as the specified GacP,Sb). With such an embodiment, only the blue-emitting component need be supplied by the conventional electroluminescent portion of the device. The electroluminescent portion of the device is adapted to be energized by an AC or DC potential applied between electrodes 48 and 52. The light-emitting portion of the device is surrounded by a light-transmitting cup-shaped member 54 which carries thereon a coating 56 of light-scattering material such as magnesia, which blends and diffuses the emitted radiations.

Figure 11:
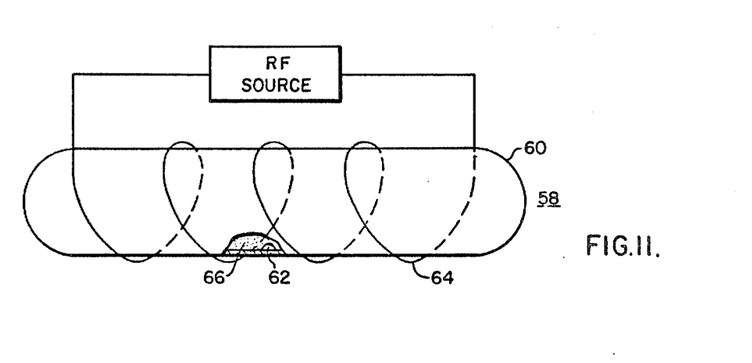
FIG. 11 is a perspective view, partly broken away, of an electrodeless discharge lamp constructed in accordance with the present invention.

An alternative type of "electrodeless" discharge device 58 is shown in FIG. 11 and comprises a vitreous envelope 60 which is filled with a small pressure of discharge-sustaining gas, such as argon, and small amounts of vaporizable rare-earth metals 62 or rare-earth metal compounds, such as thulium, terbium and europium, or thulium iodide, terbium iodide, and europium iodide. When the device 58 is energized by coupling the coil 64 to the RF source, there is generated white light with a spectral energy distribution similar to that shown in FIG. 6. In this case, the thulium or thulium iodide generates the blue emissions, the terbium or terbium iodide generates the green emissions, and the europium or europium iodide generates the red emissions. Alternatively, bismuth may be substituted for the thulium, erbium may be substituted for the terbium, and/or strontium may be substituted for the europium.

As another alternative embodiment, the lamp 58 may incorporate a coating of phosphor 66 on the interior surface thereof in order to provide supplemental radiations, and phosphor mixtures as described in the foregoing examples may be utilized.

I claim:

1. A device which efficiently generates white light and illuminates objects with a color appearance which is reasonably representative of their color appearance under natural light, said device comprising:
   (a) a three-component, light-generating medium forming an operative part of said device;
   (b) means for connecting said device to a source of predetermined electric potential to energize said medium to a visible-light-generating condition;

(c) a first component of said medium when energized exhibiting a green to yellow-green emission located substantially in the wavelength range of from 515 nm to 570 nm;

(d) a second component of said medium when energized exhibiting an orange to red emission located substantially in the wavelength range of from 588 nm to 630 nm;

(e) the third component of said medium when energized exhibiting a purplish-blue to greenish-blue emission located substantially in the wavelength range of from 430 nm to 485 nm; and (f) the relative proportions of said components of said light-producing medium being such that when their emissions are blended, there is produced white light of predetermined ICI coordinates.

2. The device as specified in claim 1 wherein, (a) said first component of said medium when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located centered within the wavelength range of from 515 nm to 570 nm, (b) said second component of said medium when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwith of less than about 40 nm as measured at an emission intensity which is 50% of the maximum measured emission intensity thereof and substantially located within the wavelength range of from 588 nm to 630 nm, and (c) said other remaining component of said medium when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwith of less than about 40 nm as measured at an emission intensity which is 50% of the maximum measured emission intensity thereof and substantially located within the wavelength range of from 430 nm to 485 nm.

3. The device as specified in claim 1, wherein said light-generating medium comprises an envelope-enclosed, discharge sustaining substance and a phosphor material coated onto the surface of said envelope.

4. The device as specified in claim 1, wherein said light-generating medium comprises electroluminescent phosphor operatively positioned between electrodes.

5. The device as specified in claim 1, wherein said light-generating medium comprises solid-state junctions.

6. The device as specified in claim 1, wherein said light-generating medium comprises an envelope-enclosed, visible-light-generating, discharge-sustaining substance and a phosphor coated onto said envelope, and an RF coil surrounding said envelope for energizing said discharge-sustaining substance.

7. The device as specified in claim 1, wherein said light-generating medium comprises an envelope-enclosed, visible-light-generating, discharge-sustaining substance, and an RF coil surrounding said envelope for energizing said discharge-sustaining substance.

8. A fluorescent discharge device comprising:

(a) a sealed, elongated, light-transmitting envelope;

(b) electrodes operatively positioned proximate each end of said envelope and adapted to be connected to a source of energizing potential;

(c) a discharge-sustaining filling comprising mercury and inert gas contained within said envelope, and said device adapted to be operated with a predetermined power input to sustain a gas discharge therein which generates ultraviolet radiations and some blue radiations;

(d) finely divided phosphor material coated onto the interior surface of said envelope, said phosphor comprising a three-component mixture of different phosphors;

(e) a first component of said phosphor when energized by said ultraviolet radiations exhibiting a greenish to yellow-green emission substantially located in the wavelength range of from 515 nm to 570 nm;

(f) a second component of said phosphor when energized by said ultraviolet radiations exhibiting an orange to red emission substantially located in the wavelength range of from 588 nm to 630 nm;

(g) the third component of said phosphor when energized by said ultraviolet radiations exhibiting purplish-blue to greenish-blue emission substantially located in the wavelength range of from 430 nm to 485 nm; and (h) the relative proportions of said light-producing phosphors being such that when their emissions are blended with the blue emission generated by said discharge, there is produced white light of predetermined ICI coordinates.

9. The device as specified in claim 8 wherein, (a) said first component of said phosphor when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm, (b) said second component of said phosphor when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwidth of less than about 40 nm as measured at an emission intensity which is 50% of the maximum measured emission intensity thereof and substantially located within the wavelength range of from 588 nm to 630 nm, and (c) said third component of said phosphor when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measured emission intensity thereof, and substantially located within the wavelength range of from 430 nm to 485 nm.

10. The fluorescent discharge device as specified in claim 8, wherein said third component of said phosphor is strontium chloro-apatite activated by divalent europium, said first component of said phosphor is calcium larsenite, and said second component of said phosphor is yttrium oxide activated by tervalent europium, with the weight ratios of said phorphor components being about 17:58:25, respectively.

11. A fluorescent discharge device comprising:
(a) a sealed, elongated, light-transmitting envelope;
(b) electrodes operatively positioned proximate each end of said envelope and adapted to be connected to a source of energizing potential;
(c) a discharge-sustaining filling comprising mercury and inert gas contained within said envelope, and said device adapted to be operated with a predetermined power input to sustain a gas discharge therein which generates ultraviolet radiations and some blue radiations;
(d) finely divided phosphor material coated onto the interior surface of said envelope, said phosphor material consisting essentially of a three-component mixture of different phosphors;
(e) a first component of said phosphor material when energized by said ultraviolet radiations exhibiting a greenish to yellow-green emission substantially located in the wavelength range of from 515 nm to 570 nm;
(f) a second component of said phosphor material when energized by said ultraviolet radiations exhibiting an orange to red emission substantially located in the wavelength range of from 588 nm to 630 nm;
(g) the third component of said phosphor material when energized by said ultraviolet radiations exhibiting purplish-blue to greenish-blue emission substantially located in the wavelength range of from 430 nm to 485 nm; and
(h) the relative proportions of said components of said phosphor material being such that when their emissions are blended with the blue emission generated by said discharge, there is produced white light of predetermined ICI coordinates.

12. The device as specified in claim 11 wherein,
(a) said first component of said phosphor material when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm,
(b) said second component of said phosphor material when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwith of less than about 40 nm as measured at an emission intensity which is 50% of the maximum measured emission intensity thereof and substantially located within the wavelength range of from 588 nm to 630 nm, and
(c) said third component of said phosphor material when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measured emission intensity thereof, and substantially located within the wavelength range of from 430 nm to 485 nm.

13. The fluorescent discharge device as specified in claim 11, wherein said third component of said phosphor material is strontium chloro-apatite activated by divalent europium, said first component of said phosphor material is calcium larsenite, and said second component of said phosphor material is yttrium oxide activated by tervalent europium, with the weight ratios of said phosphor components being about 17:58:25, respectively.

14. The fluorescent discharge device as specified in claim 13, wherein said strontium chloro-apatite has the formulation $Sr_5(PO_4)_3Cl:Eu^{2+}$, where Eu is from $3.5 \times 10^{-3}$ to $3.5 \times 10^{-2}$, said calcium larsenite has the formulation $Zn_4Ca_3Pb_1Si_4O_{16}:Mn$, and said yttrium oxide has the formulation $Y_2O_3:Eu^{3+}$, where the gram-atom ratio of Eu to Y is from 0.07:1 to 0.0825:1.

15. A device which efficiently generates white light and illuminates objects with a color appearance which is reasonably representative of their color appearance under natural light, said device comprising:
(a) a three-component, light-generating medium forming an operative part of said device;
(b) means for connecting said device to a source of predetermined electric potential to energize said medium to a visible-light-generating condition;
(c) a first component of said medium when energized exhibiting a green to yellow-green emission located substantially in the wavelength range of from 515 nm to 570 nm;
(d) a second component of said medium when energized exhibiting an orange to red emission located substantially in the wavelength range of from 588 nm to 630 nm;
(e) the third component of said medium when energized exhibiting a purplish-blue to greenish-blue emission located substantially in the wavelength range of from 430 nm to 485 nm; and
(f) the relative proportions and respective emissions of said components of said light-producing medium being such that when their emissions are blended, there is produced white light of predetermined ICI coordinates with at most only a limited amount of radiations of wavelengths shorter than 430 nm and longer than 630 nm as well as at most only a limited amount of radiations of wavelengths of about 500 nm and about 575 nm.

16. The device as specified in claim 15 wherein,
(a) said first component of said medium when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm,
(b) said second component of said medium when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwidth of less than about 40 nm as measured at an emission intensity which is 50% of the maximum measured emission intensity thereof and substantially located within the wavelength range of from 588 nm to 630 nm, and
(c) said other remaining component of said medium when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measured emission intensity thereof and substantially located within the wavelength range of from 430 nm to 485 nm.

17. The device as specified in claim 15, wherein said light-generating medium comprises an envelope-enclosed, discharge sustaining substance and a phosphor material coated onto the surface of said envelope.

18. The device as specified in claim 15, wherein said light-generating medium comprises electroluminescent phosphor operatively positioned between electrodes.

19. The device as specified in claim 15, wherein said light-generating medium comprises solid-state junctions.

20. The device as specified in claim 15, wherein said light-generating medium comprises an envelope-enclosed, visible-light-generating, discharge-sustaining substance and a phosphor coated onto said envelope, and an RF coil surrounding said envelope for energizing said discharge-sustaining substance.

21. The device as specified in claim 15, wherein said light-generating medium comprises an envelope-enclosed, visible-light-generating, discharge-sustaining substance, and an RF coil surrounding said envelope for energizing said discharge-sustaining substance.

22. A fluorescent discharge device comprising:
(a) a sealed, elongated, light-transmitting envelope;
(b) electrodes operatively positioned proximate each end of said envelope and adapted to be connected to a source of energizing potential;
(c) a discharge-sustaining filling comprising mercury and inert gas contained within said envelope, and said device adapted to be operated with a predetermined power input to sustain a gas discharge therein which generates ultraviolet radiations and some blue radiations;
(d) finely divided phosphor material coated onto the interior surface of said envelope, said phosphor comprising a three-component mixture of different phosphors;
(e) a first component of said phosphor when energized by said ultraviolet radiations exhibiting a greenish to yellow-green emission substantially located in the wavelength range of from 515 nm to 570 nm;
(f) a second component of said phosphor when energized by said ultraviolet radiations exhibiting an orange to red emission substantially located in the wavelength range of from 588 nm to 630 nm;
(g) the third component of said phosphor when energized by said ultraviolet radiations exhibiting purplish-blue to greenish-blue emission substantially located in the wavelength range of from 430 nm to 485 nm; and
(h) the relative proportions and respective emissions of said light-producing phosphors being such that when their emissions are blended with the blue emission generated by said discharge, there is produced white light of predetermined ICI coordinates with at most only a limited amount of radiations of wavelengths shorter than 430 nm and longer than 630 nm as well as at most only a limited amount of radiations of wavelengths of about 500 nm and about 575 nm.

23. The device as specified in claim 22 wherein,
(a) said first component of said phosphor when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm,
(b) said second component of said phosphor when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwidth of less than about 40 nm as measured at an emission intensity which is 50% of the maximum measured emission intensity thereof and substantially located within the wavelength range of from 588 nm to 630 nm, and
(c) said third component of said phosphor when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measure emission intensity thereof, and substantially located within the wavelength range of from 430 nm to 485 nm.

24. A fluorescent discharge device comprising:

(a) a sealed, elongated, light-transmitting envelope;
(b) electrodes operatively positioned proximate each end of said envelope and adapted to be connected to a source of energizing potential;
(c) a discharge-sustaining filling comprising mercury and inert gas contained within said envelope, and said device adapted to be operated with a predetermined power input to sustain a gas discharge therein which generates ultraviolet radiations and some blue radiations;
(d) finely divided phosphor material coated onto the interior surface of said envelope, said phosphor material consisting essentially of a three-component mixture of different phosphors;
(e) a first component of said phosphor material when energized by said ultraviolet radiations exhibiting a greenish to yellow-green emission substantially located in the wavelength range of from 515 nm to 570 nm;
(f) a second component of said phosphor material when energized by said ultraviolet radiations exhibiting an orange to red emission substantially located in the wavelength range of from 588 nm to 630 nm;
(g) the third component of said phosphor material when energized by said ultraviolet radiations exhibiting purplish-blue to greenish-blue emissions substantially located in the wavelength range of from 430 nm to 485 nm; and
(h) the relative proportions and respective emissions of said components of said phosphor material being such that when their emissions are blended with the blue emission generated by said discharge, there is produced white light of predetermined ICI coordinates with at most only a limited amount of radiations of wavelengths shorter than 430 nm and longer than 630 nm as well as at most only a limited amount of radiations of wavelengths of about 500 nm and about 575 nm.

25. The device as specified in claim 24 wherein,
(a) said first component of said phosphor material when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm,
(b) said second component of said phosphor material when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwidth of less than about 40 nm as measured at an emission intensity which is 50% of the maximum measured emission intensity thereof and substantially located within the wavelength range of from 588 nm to 630 nm, and
(c) said third component of said phosphor material when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measured emission intensity thereof, and substantially located within the wavelength range of from 430 nm to 485 nm.

26. A device which efficiently generates white light and illuminates objects with a color appearance which is reasonably representative of their color appearance under natural light, said device comprising:
(a) a three-component, light-generating medium forming an operative part of said device;
(b) means for connecting said device to a source of predetermined electric potential to energize said medium to a visible-light-generating condition;
(c) a first component of said medium when energized exhibiting a green to yellow-green emission located substantially in the wavelength range of from 515 nm to 570 nm; p1 (d) a second component of said medium when energized exhibiting an orange to red emission located substantially in the wavelength range of from 588 nm to 630 nm;
(e) the third component of said medium when energized exhibiting a purplish-blue to greenish-blue emission located substantially in the wavelength range of from 430 nm to 485 nm; and
(f) the relative proportions and respective emissions of said components of said light-producing medium being such that when their emissions are blended, there is produced white light of predetermined ICI coordinates with minimized radiations in the wavelength ranges of from 485 nm to 515 nm and from 570 nm to 588 nm and with at most only a limited amount of radiations of wavelengths shorter that 430 nm and longer than 630 nm as well as at most only a limited amount of radiations of wavelengths of about 500 nm and about 575 nm.

27. The device as specified in claim 26 wherein,
(a) said first component of said medium when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm,
(b) said second component of said medium when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwidth of less than about 40 nm as measured at an emission intensity which is 50% of the maximum measured emission intensity thereof and substantially located within the wavelength range of from 588 nm to 630 nm, and
(c) said other remaining component of said medium when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measured emission intensity thereof and substantially located within the wavelength range of from 430 nm to 485 nm.

28. A fluorescent discharge device comprising:
 (a) a sealed, elongated, light-transmitting envelope;
 (b) electrodes operatively positioned proximate each end of said envelope and adapted to be connected to a source of energizing potential;
 (c) a discharge-sustaining filling comprising mercury and inert gas contained within said envelope, and said device adapted to be operated with a predetermined power input to sustain a gas discharge therein which generates ultraviolet radiations and some blue radiations;
 (d) finely divided phosphor material coated onto the interior surface of said envelope, said phosphor comprising a three-component mixture of different phosphors;
 (e) a first component of said phosphor when energized by said ultraviolet radiations exhibiting a greenish to yellow-green emission substantially located in the wavelength range of from 515 nm to 570 nm;
 (f) a second component of said phosphor when energized by said ultraviolet radiations exhibiting an orange to red emission substantially located in the wavelength range of from 588 nm to 630 nm;
 (g) the third component of said phosphor when energized by said ultraviolet radiations exhibiting purplish-blue to greenish-blue emission substantially located in the wavelength range of from 430 nm to 485 nm; and
 (h) the relative proportions and respective emissions of said light-producing phosphors being such that when their emissions are blended with the blue emission generated by said discharge, there is produced white light of predetermined ICI coordinates with minimized radiations in the wavelength ranges of from 485 nm to 515 nm and from 570 nm to 588 nm and with at most only a limited amount of radiations of wavelengths shorter than 430 nm and longer than 630 nm as well as at most only a limited amount of radiations of wavelengths of about 500 nm and about 575 nm.

29. The device as specified in claim 28 wherein,
 (a) said first component of said phosphor when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm,
 (b) said second component of said phosphor when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwidth of less than about 40 nm as measured at an emission intensity which is 50% of the maximum measured emission intensity thereof and substantially located within the wavelength range of from 588 nm to 630 nm, and
 (c) said third component of said phosphor when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measured emission intensity thereof, and substantially located within the wavelength range of from 430 nm to 485 nm.

30. A fluorescent discharge device comprising:
 (a) a sealed, elongated, light-transmitting envelope;
 (b) electrodes operatively positioned proximate each end of said envelope and adapted to be connected to a source of energizing potential;
 (c) a discharge-sustaining filling comprising mercury and inert gas contained within said envelope, and said device adapted to be operated with a predetermined power input to sustain a gas discharge therein which generates ultraviolet radiations and some blue radiations;
 (d) finely divided phosphor material coated onto the interior surface of said envelope, said phosphor material consisting essentially of a three-component mixture of different phosphors;
 (e) a first component of said phosphor material when energized by said ultraviolet radiations exhibiting a greenish to yellow-green emission substantially located in the wavelength range of from 515 nm to 570 nm;
 (f) a second component of said phosphor material when energized by said ultraviolet radiations exhibiting an orange to red emission substantially located in the wavelength range of from 588 nm to 630 nm;
 (g) the third component of said phosphor material when energized by said ultraviolet radiations exhibiting purplish-blue to greenish-blue emission substantially located in the wavelength range of from 430 nm to 485 nm; and
 (h) the relative proportions and respective emissions of said components of said phosphor material being such that when their emissions are blended with the blue emission generated by said discharge, there is produced white light of predetermined ICI coordinates with minimized radiations in the wavelength ranges of from 485 nm to 515 nm and from 570 nm to 588 nm and with at most only a limited amount of radiations of wavelengths shorter than 430 nm and longer than 630 nm as well as at most only a limited amount of radiations of wavelengths of about 500 nm and about 575 nm.

31. The device as specified in claim 30 wherein,
 (a) said first component of said phosphor material when energized exhibiting at least one of (1) a single line emission within the wavelength range of from 515 nm to 570 nm, (2) a group of line emissions the principal members of which fall within the wavelength range of from 515 nm to 570 nm, and (3) a bell-shaped band emission or emissions having a bandwidth of less than about 80 nm as measured at an emission intensity which is 50% of the maximum measured emission intensity thereof and substantially located within the wavelength range of from 515 nm to 570 nm, (b) said second component of said phosphor material when energized exhibiting at least one of (1) a single line emission within the wavelength range of from 588 nm to 630 nm, (2) a group of line emissions the principal members of which fall within the wavelength range of from 588 nm to 630 nm, and (3) a bell-shaped band emission or emissions having a bandwidth of less than about 40 nm as measured at an emission intensity which is 50% of the maximum measured emission intensity thereof and substantially located within the wavelength range of from 588 nm to 630 nm, and (c) said third component of said phosphor material when energized exhibiting at least one of (1) a single line emission within the wavelength range of from 430 nm to 485 nm, (2) a group of line emissions the principal members of which fall within the wavelength range of from 430 nm to 485 nm, and (3) a bell-shaped band emission or emissions having a bandwidth of less than about 40 nm as measured at an emission intensity which is 50% of the maximum measured emission intensity thereof, and substantially located within the wavelength range of from 430 nm to 485 nm.

* * * * *

UNITED STATES PATENT AND TRADEMARK OFFICE
CERTIFICATE OF CORRECTION

PATENT NO. : 4,176,294
DATED : November 27, 1979
INVENTOR(S) : William A. Thornton, Jr.

It is certified that error appears in the above-identified patent and that said Letters Patent are hereby corrected as shown below:

Column 1, line 8, "96,774" should read -- 96,744 --; line 21, "efficiency" should read -- efficiently --; line 33, "be" should read -- by --; line 51, "coloar" should read -- color --.

Column 4, line 12, "daylight"." should read -- daylight. --.

Column 5, line 1, "radiator" should read -- radiation --; line 24, "450" should read -- 430 --.

Column 8, line 18, "GacP,Sb)" should read -- Ga(P,Sb) --; line 26, "GacP,Sb)" should read -- Ga(P,Sb) --.

Column 9, line 38, "bandwith" should read -- bandwidth --; line 50, "bandwith" should read -- bandwidth --.

Column 11, line 17, "phorphor" should read -- phosphor --.

Column 12, line 6, "bandwith" should read -- bandwidth --.

Signed and Sealed this

Eleventh Day of October 1983

[SEAL]

Attest:

GERALD J. MOSSINGHOFF

Attesting Officer    Commissioner of Patents and Trademarks